United States Patent
Saito

(10) Patent No.: US 8,922,236 B2
(45) Date of Patent: Dec. 30, 2014

(54) SEMICONDUCTOR MEMORY DEVICE AND METHOD FOR INSPECTING THE SAME

(75) Inventor: Toshihiko Saito, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 493 days.

(21) Appl. No.: 13/225,892

(22) Filed: Sep. 6, 2011

(65) Prior Publication Data

US 2012/0062267 A1    Mar. 15, 2012

(30) Foreign Application Priority Data

Sep. 10, 2010   (JP) ................... 2010-202836

(51) Int. Cl.
*G01R 31/02*       (2006.01)
*G11C 16/04*       (2006.01)
*G11C 11/403*      (2006.01)
*G11C 16/26*       (2006.01)

(52) U.S. Cl.
CPC .......... *G11C 11/403* (2013.01); *G11C 16/0483* (2013.01); *G11C 16/26* (2013.01); *G11C 16/0433* (2013.01)
USPC ..................... 324/762.01; 365/201

(58) Field of Classification Search
CPC ..... G01R 31/2642; G11C 29/04; G11C 29/50
USPC ..................... 324/762.01; 438/10, 11, 17, 18; 365/201, 149
See application file for complete search history.

(56) References Cited

U.S. PATENT DOCUMENTS

| | | | |
|---|---|---|---|
| 4,038,646 A * | 7/1977 | Mehta et al. | 365/186 |
| 4,466,081 A | 8/1984 | Masuoka | |
| 5,469,394 A * | 11/1995 | Kumakura et al. | 365/201 |
| 5,546,402 A * | 8/1996 | Niijima et al. | 714/710 |
| 5,771,187 A * | 6/1998 | Kapoor | 365/149 |
| 6,127,702 A | 10/2000 | Yamazaki et al. | |
| 6,181,154 B1 * | 1/2001 | Beffa | 324/756.02 |
| 6,285,618 B1 * | 9/2001 | Shore | 365/222 |
| 7,372,719 B2 * | 5/2008 | Zimmermann et al. | 365/149 |

(Continued)

FOREIGN PATENT DOCUMENTS

| | | |
|---|---|---|
| EP | 0 053 878 B1 | 8/1985 |
| JP | 57-105889 A | 7/1982 |

OTHER PUBLICATIONS

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; vol. 51; No. 11; pp. 1805-1810.

(Continued)

*Primary Examiner* — Patrick Assouad
*Assistant Examiner* — Demetrius Pretlow
(74) *Attorney, Agent, or Firm* — Fish & Richardson P.C.

(57) ABSTRACT

A potential of a gate of the transistor of the memory cell is held at a predetermined potential VGM which is between a potential VGL used in normal holding and a threshold of the transistor Vth. When the potential is held for a predetermined period, the memory cell becomes in a similar state in which the memory cell is held at a potential VGL in 10 years. A memory cell, which does not hold data sufficiently at this time, can be judged not to hold data for 10 years in normal use.

10 Claims, 11 Drawing Sheets

(56) References Cited

U.S. PATENT DOCUMENTS

| | | | |
|---|---|---|---|
| 2002/0085406 A1* | 7/2002 | McClure | 365/145 |
| 2004/0153275 A1* | 8/2004 | Wang | 702/117 |
| 2005/0199879 A1 | 9/2005 | Hoffman et al. | |
| 2007/0076515 A1* | 4/2007 | Shionoiri et al. | 365/230.06 |
| 2007/0194379 A1 | 8/2007 | Hosono et al. | |
| 2010/0079150 A1* | 4/2010 | Hoffmann et al. | 324/548 |
| 2010/0148171 A1 | 6/2010 | Hayashi et al. | |
| 2011/0089419 A1 | 4/2011 | Yamazaki et al. | |
| 2011/0101351 A1 | 5/2011 | Yamazaki | |
| 2011/0186837 A1 | 8/2011 | Takahashi et al. | |
| 2011/0194332 A1 | 8/2011 | Saito | |
| 2011/0199807 A1 | 8/2011 | Saito et al. | |

OTHER PUBLICATIONS

Wonchan Kim et al.; "An Experimental High-Density DRAM Cell with a Built-in Gain Stage"; IEEE Journal of Solid-State Circuits; Aug. 1, 1994; vol. 29, No. 8; pp. 978-981.

Shoji Shukuri et al.; "A Complementary Gain Cell Technology for Sub-1 V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; vol. 41, No. 6; pp. 926-931.

* cited by examiner

VGH ≧ Vth+VDH
VDL < VDH

SEMICONDUCTOR MEMORY DEVICE AND METHOD FOR INSPECTING THE SAME

BACKGROUND OF THE INVENTION

1. Field of the Invention

The present invention relates to a memory device using a semiconductor.

2. Description of the Related Art

There are many kinds of memory devices using semiconductors. For example, a dynamic random access memory (DRAM), a static random access memory (SRAM), an electrically erasable and programmable read only memory (EEPROM), a flash memory, and the like can be given.

In a DRAM, data is stored by holding charge in a capacitor which is provided in a memory cell. However, in a DRAM which is commercially available, even when a transistor used for switching is in an off state, a slight amount of leakage current is generated between a source and a drain; thus, the data is lost within a relatively short time. Therefore, the data needs to be rewritten (refreshed) in a certain cycle (generally once every several tens of milliseconds).

In an SRAM, data is held by utilizing a bistable state of a flip-flop circuit. A CMOS inverter is generally used in a flip-flop circuit of an SRAM. Since six transistors are used in one memory cell, an integration degree of the SRAM is lower than that of a DRAM. In addition, the data is lost when power is not supplied.

On the other hand, in an EEPROM or a flash memory, a so-called floating gate is provided between a channel and a gate and charge is stored in the floating gate, whereby data is held. In this specification, a memory having a floating gate, examples of which are an EEPROM and a flash memory, is called a floating gate non-volatile memory (FGNVM). The charge stored in the floating gate is held even after supplying power to a transistor stops, which is why these memories are called non-volatile memories. For example, Patent Document 1 may be referred to for a flash memory.

Since multilevel data can be stored in one memory cell in an FGNVM, storage capacity can be large. Further, since the number of contact holes can be significantly decreased in a NAND-type flash memory, an integration degree can be increased to some extent.

However, in an FGNVM, high voltage is needed at the time of injection of charge to a floating gate or removal of the charge. Because of this, deterioration of a gate insulating film cannot be avoided and it is not possible to limitlessly repeat writing and erasing operations.

REFERENCE

Patent Document

[Patent Document 1] Japanese Published Patent Application No. S57-105889
[Patent Document 2] United States Patent Application Publication No. 2005/0199879
[Patent Document 3] United States Patent Application Publication No. 2007/0194379

SUMMARY OF THE INVENTION

As described above, a conventional semiconductor memory device has good points and bad points and there has been no semiconductor devices meeting all necessary conditions. There are some characteristics required for a semiconductor memory device such as low power consumption, the number of rewriting times. When the power consumption is high, the size of a device for supplying power needs to be larger, or an operating time on a battery is shortened. Moreover, a semiconductor element may be heated; thus, the characteristics of the element may be deteriorated, and in some cases, a circuit is damaged. In addition, there is preferably no limitation on the number of rewriting times of a semiconductor memory device and it is desirable that rewriting can be performed one billion times or more.

A conventional DRAM has a problem with power consumption because of its large leakage current caused by using a silicon semiconductor, and thus refresh operations are performed several tens of times per second. In contrast, in an SRAM, there is another problem in that the integration degree cannot be increased because six transistors are included in one memory cell. Moreover, an FGNVM does not have a problem with power consumption, but the number of rewriting times is limited to a hundred thousand or less.

It is an object of one embodiment of the present invention to provide a highly reliable memory cell in which long-term data storage can be ensured and to provide a method for inspecting the semiconductor memory device.

It is another object of one embodiment of the present invention to provide a novel semiconductor device (in particular, a semiconductor memory device). It is another object to provide a novel method for inspecting a semiconductor device (in particular, a method for inspecting a semiconductor memory device). Further, it is another object to provide a novel method for manufacturing a semiconductor device (in particular, a method for manufacturing a semiconductor memory device). It is another object to provide a novel method for driving a semiconductor device (in particular, a method for driving a semiconductor memory device). In the present invention, at least one of the above-described objects is achieved.

The present invention will be described below; terms used in this specification are briefly described. In this specification, when one of a source and a drain of a transistor is called a source, the other is called a drain for convenience, and they are not particularly distinguished for the following reasons: a source and a drain have the same or substantially the same structure and function; and even when the structures are different, potential applied to a source and a drain is not constant and polarity of the potential is not always the same. Therefore, a source in this specification can be alternatively referred to as a drain.

In this specification, "to be orthogonal to each other (in a matrix)" means not only to intersect with each other at right angles but also to be orthogonal to each other in the simplest circuit diagram even though the physical angle is not a right angle. In addition, "to be parallel to each other (in a matrix)" means to be parallel to each other in the simplest circuit diagram even though two wirings are provided so as to physically intersect with each other.

Further, even when the expression "to be connected" is used in this specification, there is a case in which no physical connection is made in an actual circuit and a wiring is just extended. For example, there is a case in which one wiring serves as gates of a plurality of transistors. In that case, one wiring may have a plurality of branches to gates in a circuit diagram. In this specification, the expression "a wiring is connected to a gate" is also used to describe such a case.

One embodiment of the present invention is a method for inspecting a semiconductor memory device including a plurality of memory cells each including at least one capacitor and a transistor whose source is connected to the capacitor, including a first process in which a charge is stored in the capacitor in the memory cell; a second process in which a potential of a gate is held for the predetermined period in a state where the potential of the gate of a transistor is held at a predetermined potential which is between a potential used for a normal holding and a threshold of the transistor, for a predetermined period after the first process; and a third process in which an amount of the charge stored in the capacitor is measured after the second process.

One embodiment of the present invention is a semiconductor memory device which includes a plurality of memory cells each including at least one capacitor and a transistor whose source is connected to the capacitor and further includes a pad which supplies a potential from an external device so that a potential of a gate of the transistor is set to a predetermined potential which is between a potential used for a normal holding and a threshold of the transistor.

In the above semiconductor memory device, a drain of the transistor is preferably connected to a wiring to which a data signal is sent (e.g., a bit line) and a gate of the transistor is preferably connected to a wiring to which a row selection signal is sent (e.g., a word line).

Moreover, in the above semiconductor memory device, the transistor may be N-channel type. The resistance between the source and the drain may be higher than or equal to $1\times10^{18}\Omega$, the resistance is preferably higher than or equal to $1\times10^{24}\Omega$ when the potential of the gate of the transistor is appropriate. Further, the current between the source and the drain (the drain current) may be less than or equal to $1\times10^{-18}$ A, the current is preferably less than or equal to $1\times10^{-24}$ A.

The memory cell may further include at least one transistor (element transistor), the source of the transistor connected to the capacitor may be connected to the gate of the element transistor.

In the above semiconductor memory device, the memory cell whose amount of the charge is not judged to satisfy the standard by the third process may be replaced with a spare memory cell.

At least one element transistor is preferably formed from a single crystal semiconductor. As the single crystal semiconductor, a known material such as single crystal silicon, single crystal germanium, single crystal silicon germanium, or single crystal gallium arsenide can be used.

A wide band-gap oxide semiconductor which has been found in recent years (see Patent Document 2 and 3) has very few thermally excited carriers. Thus, the resistance between the source and the drain can be unbelievably higher than that of a conventional silicon semiconductor, or the drain current can be unbelievably lower than that of a conventional silicon semiconductor by reducing the concentration of a donor or an acceptor (which, in this specification, means the concentration of ionized elements among the elements or the like which can be donors or acceptors; thus the concentration of a donor or an acceptor is synonymous with the carrier concentration which is derived from a donor or an acceptor.), to be lower than or equal to $1\times10^{14}$ cm$^{-3}$, for example.

When a circuit in which a transistor using such a semiconductor is combined with a capacitor and the capacitor stores a charge by using the transistor as a switching element is formed, the charge can be held for a long term, for example, 10 years or more.

For example, in the case where the circuit is configured with a transistor whose resistance between a source and a drain is $1\times10^{24}\Omega$ when a potential of a gate is set to a specific value and a capacitor whose capacitance is $1\times10^{-15}$ F, a time constant is $1\times10^{9}$ seconds, that is, about 32 years. In other words, it takes 32 years to reduce the charge stored in the capacitor to about 37% of the initial amount of the charge, and about 73% of the initial charge is held even after 10 years pass.

When a memory cell or a memory device is manufactured using such a circuit, data can be held for an extremely long time and power consumption can be sufficiently lowered.

However, not all the transistors show such characteristics. A sufficient amount of a charge can not be stored in the capacitor, because the resistance of a transistor is $\frac{1}{10}$ of a normal one when data being held, the resistance of a transistor is high (on-current is small) when data is written, and the size of a capacitor or the thickness of the dielectric is different from a normal one. In such a case where a transistor or a capacitor has problems as described below, the problems needed to be found early.

In the case where a transistor or a capacitor is not operated apparently, such a transistor or capacitor can be found in an extremely short time. However, in the case where a period that holds a charge is slightly shorter than a normal one for such a reason, it is not easy to find such a transistor or capacitor. This is because a period at least one year or more is needed to find such a transistor or capacitor.

An actual inspection of a semiconductor device needs to be finished shortly after the manufacturing of the semiconductor device. After the manufacturing, inspection conducted for months causes a significant increase of the manufacturing cost. In the case where the semiconductor devices are shipped without elimination of defective pieces, a problem that some data is lost occurs when the data is held for 10 years. That is, reliability of the semiconductor memory device is reduced. There has been no effective approach to such a problem conventionally.

FIG. 2 shows a relation between a potential of a gate (VG) and a drain current (ID) of an N-channel transistor manufactured using a wide band gap oxide semiconductor (ID-VG curve). FIG. 2 shows the result of the calculation for easy understanding, because the measurement of a current value which is lower than or equal to $1\times10^{-13}$ A is difficult in reality.

Note that it is easily understood by those skilled in the art that a characteristic of a P-channel transistor is symmetric with the vertical axis of FIG. 2. Hereinafter, only an N-channel transistor is described, but a P-channel transistor can be similarly applied.

For example, the drain current is $1\times10^{-24}$ A when the potential of the gate is VGL, and the drain current is $1\times10^{-5}$ A when the potential of the gate is VGH. Therefore, after the transistor is turned on, the potential of the gate may be VGH in order to store the charge in the capacitor, and the potential of the gate may be VGL in order to hold the charge in the capacitor by increasing the insulating property of the transistor.

Threshold (Vth) is the value which represents the characteristics of the transistor, and VGH is higher than the threshold. In the region lower than the threshold (the region shown by A in FIG. 2), the drain current is reduced rapidly. This slope is one of the characteristics of the transistor, called subthreshold (S value), and defined by the amount of decrease in the potential of the gate which is needed to reduce the drain current by an order of magnitude.

In particular, in the transistor which uses a thin oxide semiconductor film in which the amount of the donor or the accepter is so small that they cannot be detected, a value extremely close to a physical lower limit (59 mV/decade at room temperature) is obtained. For example, when the S value is 60 mV/decade and the potential of the gate is VGM which is higher than VGL by 0.54 V, the drain current is $1 \times 10^{-15}$ A increased one billion times and the resistance between the source and the drain is reduced to one-billionth of the resistance.

If the potential of the gate is set to VGM and the charge in the capacitor is held, the time constant of the normal circuit is 1 second. After 0.3 seconds pass, 74% of the initial amount of a charge are held. If the circuit holds the charge for only 1/10 period of the normal circuit, the amount of the charge is about 37% of the initial charge after 0.1 seconds, and only about 5% of the initial charge are left after 0.3 seconds.

That is, by setting the potential of the gate to the appropriate potential between the potential used for the normal holding and the threshold, the resistance of the transistor can be reduced, the charge in the capacitor can be easily leak, and the phenomenon occurring for which it takes 10 years or more in the normal case can be realized in a shorter period. That is, an acceleration test can be operated. As above described, it can be judged whether the transistor is a good or defective product in normal use by comparing the amount of the charge with the charge after 0.3 seconds.

In the above example, VGM is (VGL+0.54) [V], but this is based on the assumption that the S value is 60 mV/decade. Since S value is changed due to various factors, VGM is needed to set to the value according to the change. The appropriate value of VGM is changed by the time of holding. Though the holding time is 0.3 seconds in the above example, for example, when VGM is (VGL+0.42) [V], the holding time can be 30 seconds.

The appropriate value of VGM is changed by the capacitance of the capacitor. For example, when the capacitance of the capacitor is $1 \times 10^{-15}$ F, VGM that makes the drain current be greater than or equal to $1 \times 10^{-16}$ A and less than or equal to $1 \times 10^{-14}$ A may be set. Further, when the capacitance of the capacitor is $1 \times 10^{-12}$ F, VGM that makes the drain current be greater than or equal to $1 \times 10^{-13}$ A and less than or equal to $1 \times 10^{-11}$ A may be set. Moreover, the appropriate value of VGM is changed by the holding period which is desired (ensured) in normal use.

By employing any of the above-described embodiments, at least one of the above-described objects can be achieved. Note that the semiconductor memory device of the above-described embodiments does not require a high voltage which is needed for writing and erasing data in an FGNVM and does not have a limitation on the number of rewriting times.

The above-described embodiments include a novel semiconductor device (particularly, a semiconductor memory device) according to an unprecedented technical idea and a novel method for inspecting a semiconductor device (particularly, a method for inspecting a semiconductor memory device) according to an unprecedented technical idea. These embodiments have features such as power saving and a high degree of integration.

Each of the above-described embodiments provides at least one of the above-described effects. It is needless to say that each of the above-described embodiments does not have to provide all the above-described effects. The disclosed embodiment of the present invention should not be construed as being limited thereto; more various embodiments of the present invention will be disclosed in the following embodiments. These embodiments can achieve at least one of the above-described objects.

DETAILED DESCRIPTION OF THE INVENTION

Figure 1A:
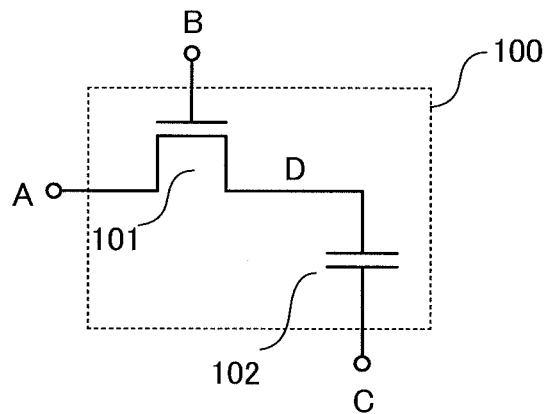
FIGS. 1A to 1C are diagrams each illustrating an example of a semiconductor memory cell.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

The structures, the conditions, and the like disclosed in any of the following embodiments can be combined with those disclosed in other embodiments as appropriate. Note that in structures described below, the same portions or portions having similar functions are denoted by the same reference numerals in different drawings, and detailed description thereof is not repeated in some cases. Note that in numeral references described below, in the case where a number or a character string is written after an underscore (_) after a numeral (e.g., "word line 104_*n*"), the number or the character string shows a row number or a column number.

Embodiment 1

FIG. 1A shows a circuit diagram of a memory cell used in this embodiment. A memory cell 100 shown in FIG. 1A includes a transistor 101 and a capacitor 102, and a source of the transistor 101 is connected to an electrode of the capacitor 102.

Figure 2:
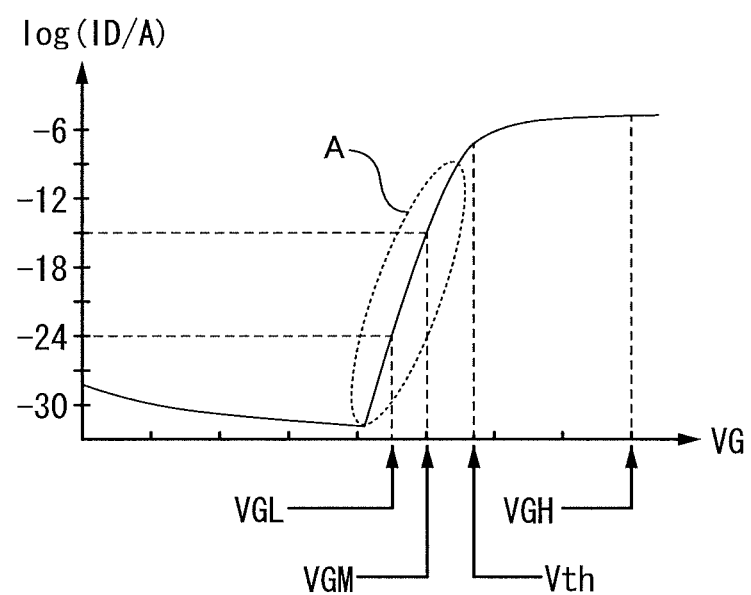
FIG. 2 is a graph showing characteristics of a transistor.

As the transistor 101, a transistor whose drain current ID in the case where an appropriate potential VGL is applied to a terminal B (a gate of the transistor 101) is less than or equal to $1 \times 10^{-18}$ A, preferably less than or equal to $1 \times 10^{-21}$ A, more preferably less than or equal to $1 \times 10^{-24}$ A may be used. For example, a transistor which has characteristics as shown in FIG. 2 may be used.

Such a transistor, for example, can be obtained by using a material whose donor or acceptor concentration is less than or equal to $1 \times 10^{14}$ cm$^{-3}$ preferably less than or equal to $1 \times 10^{11}$ cm$^{-3}$ and band gap is greater than or equal to 2.5 eV, preferably greater than or equal to 3.0 eV and less than or equal to 4.0 eV. For example, any kinds of oxide semiconductors may be used for the transistor. Note that in order to form a practical transistor, a field-effect mobility needs to be 5 cm$^2$/Vs or more, preferably 10 cm$^2$/Vs or more.

In order to achieve the above purpose, an oxide semiconductor containing at least indium (In) or zinc (Zn) is preferably used. In particular, both In and Zn are more preferably contained. As a stabilizer for reducing variation in electrical characteristics of a transistor including the oxide, gallium (Ga) is preferably additionally contained. Further, Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main component, in which there is no particular limitation on the ratio of In:Ga:Zn. The In—Ga—Zn-based oxide may contain a metal element other than In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material expressed by a chemical formula, $In_2SnO_5(ZnO)_n$ (n>0 is satisfied, and n is a natural number) may be used.

For example, it is possible to use an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, the composition is not limited to those described above, and a material having the appropriate composition may be used depending on necessary semiconductor characteristics (e.g., mobility, threshold voltage, and variation). In order to obtain necessary semiconductor characteristics, it is preferable that the carrier concentration, the impurity concentration, the defect density, the atomic ratio of a metal element to oxygen, the interatomic distance, the density, and the like be set to be appropriate.

For example, with the In—Sn—Zn-based oxide, a high mobility can be relatively easily obtained. However, the mobility can be increased by reducing the defect density in the bulk also in the case of using the In—Ga—Zn-based oxide.

Note that the case where the composition of an oxide having an atomic ratio of In:Ga:Zn=a:b:c (a+b+c=1) is in the neighborhood of the composition of an oxide having an atomic ratio of In:Ga:Zn=A:B:C (A+B+C=1) means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained relatively easily, so that when a transistor is manufactured with the use of the oxide semiconductor, interface scattering can be reduced, and relatively high mobility can be obtained relatively easily.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness ($R_a$) of less than or equal to 1 nm, preferably less than or equal to 0.3 nm, more preferably less than or equal to 0.1 nm.

Note that the average surface roughness ($R_a$) is obtained by expanding, into three dimensions, centerline average roughness that is defined by JIS B 0601 so as to be able to apply it to a surface. The $R_a$ can be expressed as an "average value of the absolute values of deviations from a reference surface to a designated surface." The $R_a$ can be measured using an atomic force microscope (AFM).

Figure 3A:
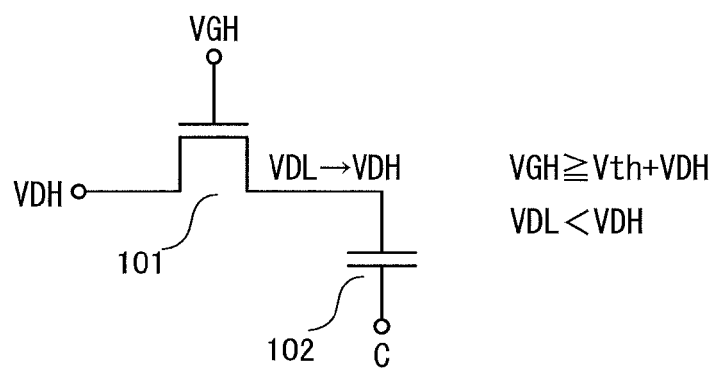
FIGS. 3A to 3D are diagrams illustrating an example of a method for inspecting a semiconductor memory device.

An operation of the memory cell 100 shown in FIG. 1A will be described with reference to FIG. 1A, FIG. 3A, and FIG. 3B. Data is held as a charge, which is stored in the capacitor 102. At an initial stage, a potential of the terminal A and a potential of the terminal B are held at VDL and VGL respectively. Here, the potential VGL is also called a "holding potential", because the potential is used when data is held in normal use. The terminal C is held at an appropriate potential (e.g., a ground potential). At this time, a potential of a source D of the transistor 101 is VDL.

When data is written to the memory cell 100, a potential according to data is applied to the terminal A. Here, for example, a potential VDH (>VDL) is applied to the terminal A. Further, a potential which is higher than or equal to the threshold Vth of the transistor 101, for example a potential VGH which is higher than or equal to the sum of Vth and VDH is applied to the terminal B. Thus, a charge is stored in the capacitor 102, the potential of the source D of the transistor 101 is increased from VDL to VDH as shown in FIG. 3A.

Figure 3B:
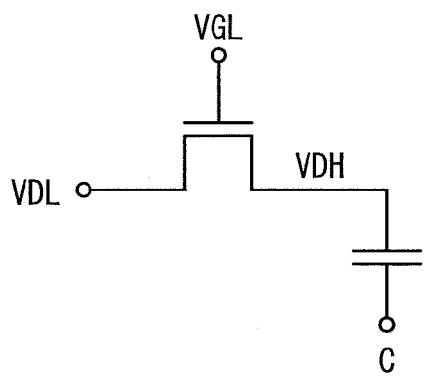

When data is held, a potential of the terminal A and a potential of the terminal B are held at VDL and VGL respectively similar to the initial stage (see FIG. 3B). Under the conditions, resistance between the source and the drain of the transistor 101 is extremely high. For example, when the capacitance of the capacitor 102 is $1\times10^{-15}$ F and resistance between the source and the drain of the transistor 101 is $1\times10^{24}\Omega$, about 74% of the initial charge remains in the capacitor 102 even after 10 years pass.

When data is read, in a state where the potential of the terminal A is held at VDL, the potential of the terminal B is set to VGH. Then, the charge stored in the capacitor 102 is transferred to the terminal A, the potential of the terminal A changes. On the basis of whether the change of the potential is greater than the reference or not, data held in the memory cell is known. Thus, since the charge stored in the capacitor is lost when the reading is operated, writing needs to be performed again after the reading.

Figure 5:
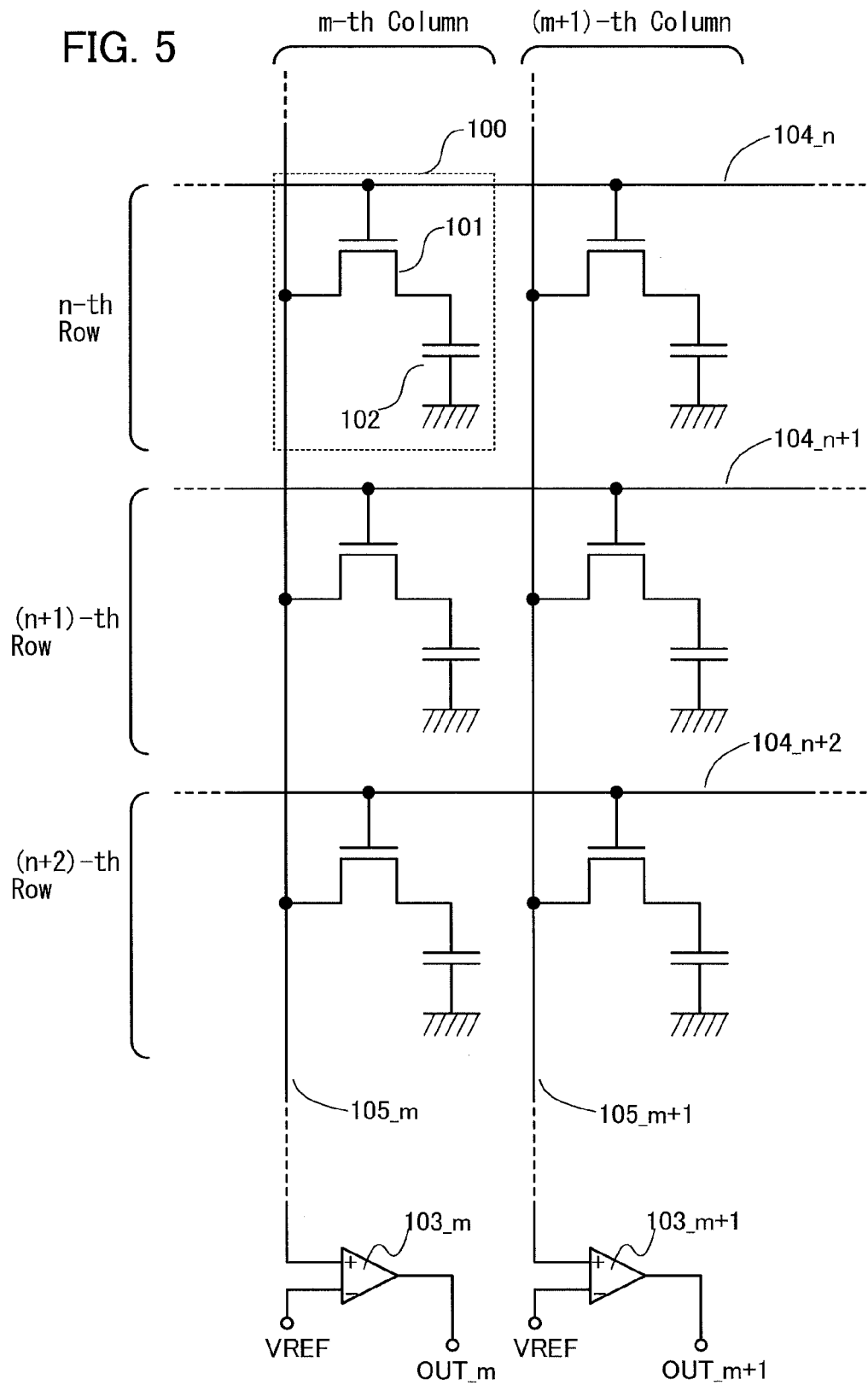
FIG. 5 is a diagram illustrating an example of a semiconductor memory device.

FIG. 5 illustrates a semiconductor memory device including such a memory cell 100. Here, only six memory cells in an n-th row and an m-th column to an (n+2)-th row and an (m+1)-th column of the semiconductor memory device are illustrated. Each memory cell 100 has the transistor 101 and the capacitor 102 as shown in FIG. 1A Further, the gates of the transistors 101 in the respective rows are connected to word lines 104_n, 104_n+1, and 104_n+2, the drains of the transistors 101 in respective columns are connected to bit lines 105_m and 105_m+1. One end of the bit lines 105_m and 105_m+1 are connected to one of input terminals of a sense amplifier 103_m and one of input terminals of a sense amplifier 103_m+1 respectively. A reference signal VREF is input to the other input terminal of sense amplifiers 103_m and the other input terminal of sense amplifiers 103_m+1. Then, outputs OUT_m and OUT_m+1 of sense amplifiers 103_m and 103_m+1 become data which is read.

The capacitance of the capacitor 102 needs to be somewhat larger than the capacitance of the bit lines 105_m or 105_m+1 (including parasitic capacitance) to prevent an error at reading of data. The capacitance of the capacitor 102 may be larger than or equal to $1 \times 10^{-15}$ F.

Writing data to such a semiconductor memory device can be performed as follows: one of potentials of all the word lines including the word lines 104_n, 104_n+1, and 104_n+2 is VGH, potentials of the other word lines are VGL, and potentials of all the bit lines including the bit lines 105_m and 105_m+1 are potentials according to writing data to be written. Reading data from the semiconductor memory device can be performed as follows: one of potentials of all the word lines including the word lines 104_n, 104_n+1, and 104_n+2 is VGH, potentials of the other word lines are VGL, and the potential change of all of the bit lines including the bit lines 105_m and 105_m+1 is detected by the sense amplifiers 103_m and 103_m+1. Further, data in the semiconductor memory device is held as follows: potentials of all the word lines including the word lines 104_n, 104_n+1, and 104_n+2 are VGL and potentials of all the bit lines including the bit lines 105_m and 105_m+1 are VDL.

In such a semiconductor memory device, a method for detecting a memory cell which has difficulty in holding data will be described with reference to FIG. 1A, FIG. 3A, FIG. 3C and FIG. 3D. First, a charge is stored in the capacitor 102 as shown in FIG. 3A. Here, a potential of the terminal A is VDH.

Then a charge is held. At that time, the potential of the terminal B is set to the predetermined potential VGM between a potential VGL which is used in holding a charge normally and threshold Vth. An optimal value of the potential VGM varies depending on the capacitance of the capacitor 102, a period of holding data in normal use, a characteristic of the transistor 101 (in particular, S value), and a period of holding data for the inspection.

For example, when the capacitance of the capacitor 102 is $1 \times 10^{-15}$ F and it ensures that data can be held for 10 years in normal use, resistance between a source and a drain of the transistor 101 is preferably higher than or equal to $1 \times 10^{24} \Omega$ at a potential VGL used in data holding. Moreover, when the S value of the transistor 101 is 60 mV/decade and a holding time for the inspection of data holding capability of the memory cell is 0.3 seconds, the potential VGM may be (VGL+0.54) [V].

Figure 3C:
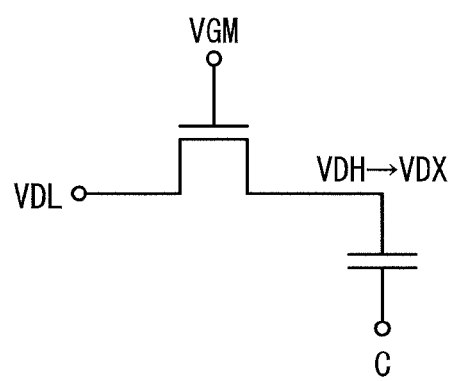
Figure 3D:
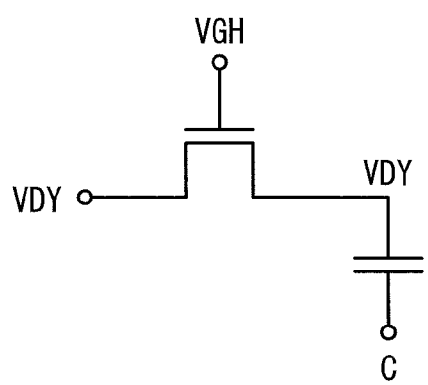

In the holding period, the potential of the source of the transistor 101 is decreased from the initial VDH to VDX (VDL<VDX<VDH) (see FIG. 3C). This is in the same state in which 10 years have passed in the normal data holding (the state in which the potential of the terminal B is held at VGL).

After the holding period, the potential of the terminal A is set to be VDM. The potential VDM is a normally average value of the potential VDH and VDL, (VDH+VDL)/2. Further, when the potential of the terminal B is VGH, the charge stored in the capacitor 102 is released to the terminal A. Then, the potential of the terminal A becomes VDY (see FIG. 3D).

At this time, if there is no capacitance other than that of the capacitor 102 in the circuit, VDY is equivalent to VDX. However, practically, the relation, VDM<VDY<VDX, is satisfied because there are various capacitance. Therefore, data cannot be read unless VDY is somewhat larger than VDM. Though the detailed description is omitted, it can be judged that the data holding capability of the memory cell which cannot output the data same as that in writing is low.

For example, a memory cell which can hold data for 10 years or more in normal use can output same data as writing data after the test with the above condition. On the other hand, in a memory cell which can hold data for only about one year in normal use, the potential VDX of the source of the transistor 101 is decreased considerably. As a result, data which varies from writing data is read. Therefore, this inspection can judge whether the holding capability of data is enough or not.

Meanwhile, VGM is in the range from (VGL+0.48) [V] to (VGL+0.54) [V], an accurate value of VGM may not be found in some cases, because the potential VGM used in the above inspection cannot be controlled with sufficient accuracy.

For example, when the potential VGM is (VGL+0.48) [V], even a memory cell which can hold data for only about one year in normal use is judged as a good product by a holding process for 0.3 seconds. On the contrary, when the potential VGM is (VGL+0.54) [V], most of the memory cells are judged as defective products by a holding process for 3 seconds. That is, when the condition of the holding time is set to only one, there is a case where the accurate evaluation cannot be conducted.

In order to prevent such a situation, for example, two or more holding times are provided and the inspection is operated at least twice. Preferably, three or more holding times (e.g., 0.3 seconds, 1 second, and 3 seconds) are provided, the inspection may be operated at least three times.

For example, the capacitance of the capacitor 102 is $1 \times 10^{-15}$ F, VDL is 0V, VDH is 2V, and the potential of the terminal C is 0V. When the transistor 101 has the characteristics shown in FIG. 2 and the potential of the terminal B is VGL, 84% of the initial charge is held at a rough estimate 10 years later. When 50% of the initial charge is held in the normal memory cell 10 years later, a leakage current when the potential of the terminal B is VGL is required to be lower than or equal to $4.4 \times 10^{-24}$ A.

When the potential of the terminal B is (VGL+0.48) [V], a drain current becomes increased one hundred million times. In the above normal memory cell, the charge held 0.3 seconds later is 93% of the initial charge. Meanwhile, 80% of the initial charge is held 1 second later and 52% of the initial charge is held 3 seconds later.

When the potential of the terminal B is (VGL+0.54) [V], a drain current becomes increased one thousand million times. In the above normal memory cell, the charge held 0.3 seconds later is 52% of the initial charge. Meanwhile, 11% of the initial charge is held 1 second later and 0.1% of the initial charge is held 3 seconds later.

In order to enhance the accuracy, the inspection may be performed plural times in the same holding time. Though the potential VGM is expected to be the same value every times in the inspection performed plural times, the potential VGM varies by some reasons in some cases. The inspection is preferably performed plural times under the same conditions so as to remove the error generated from such a variation.

The above described is the inspecting method for a single memory cell; however, a semiconductor memory device in which memory cells are provided in a matrix as shown in FIG. 5 can be also inspected in the same way. That is, after data is written to a memory cell in a row which is to be inspected, the potential of the word line 104 in the row is held at the above described potential VGM for a predetermined period. After that, reading data is operated and the data may be compared with the initial data. During holding the data, writing or reading data in another row may be operated.

The memory cell judged as a defective by such an inspection is preferably replaced with a spare memory cell.

Note that the potential VGM used in the above-described inspection is needed only in the inspection and is not used in a normal operation. Therefore, it is useless to provide a circuit for generating the potential VGM in a semiconductor memory device. Further, the accuracy of the potential is required to be lower or equal to 60 mV, preferably lower or equal to 10 mV. For the above reason, the potential VGM may be introduced into the word line 104 from the external device.

Figure 10A:
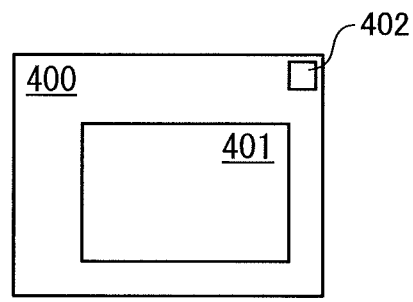
FIGS. 10A and 10B are diagrams illustrating an example of a semiconductor memory device.

For example, as shown in FIG. 10A, a pad 402 for introducing the potential VGM from the outside is provided in a semiconductor memory device having a region in which memory cells are provided in a matrix (hereinafter, referred to as a memory cell array 401) over a chip 400.

Figure 10B:
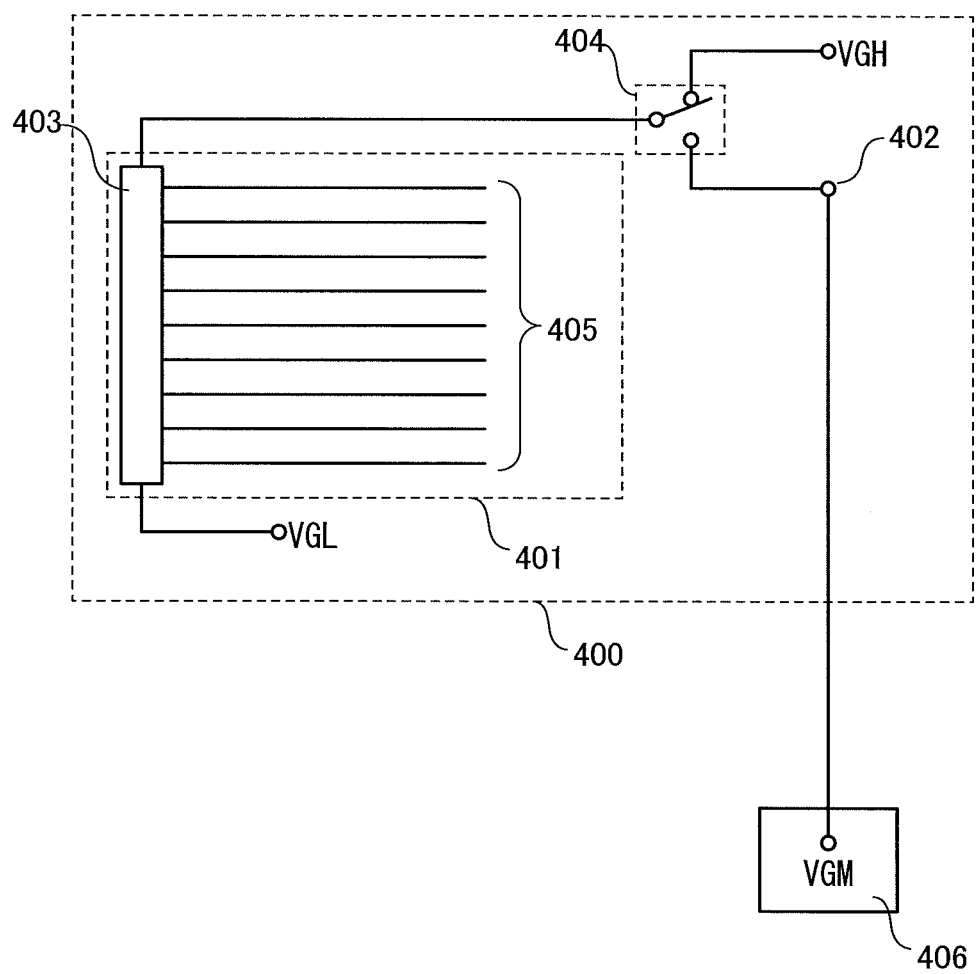

The circuit configuration of the semiconductor memory device shown in FIG. 10A is illustrated in FIG. 10B. As shown in FIG. 10B, the memory cell array 401 is provided in the chip 400, and a decoder 403 which supplies a potential to the word line 405 is provided in the memory cell array 401.

Since the two potentials VGH and VGL are applied to the word line usually, the decoder has two input terminals for the VGH and VGL. The potential of one terminal is fixed to VGL. However, the potential of the other terminal can be switched between two stages by a switch 404 outside the memory cell array 401. Note that the switch 404 is preferably formed using a transistor or the like.

One input terminal of the switch 404 is fixed to the potential VGH. The other input terminal is connected to the pad 402. The pad 402 is connected to an external power supply 406 which supplies the potential VGM through a prober or the like when the memory cell is inspected. The accuracy of the potential supplied from the external power supply 406 may be lower than or equal to 10 mV, preferably lower than or equal to 1 mV.

Figure 11A:
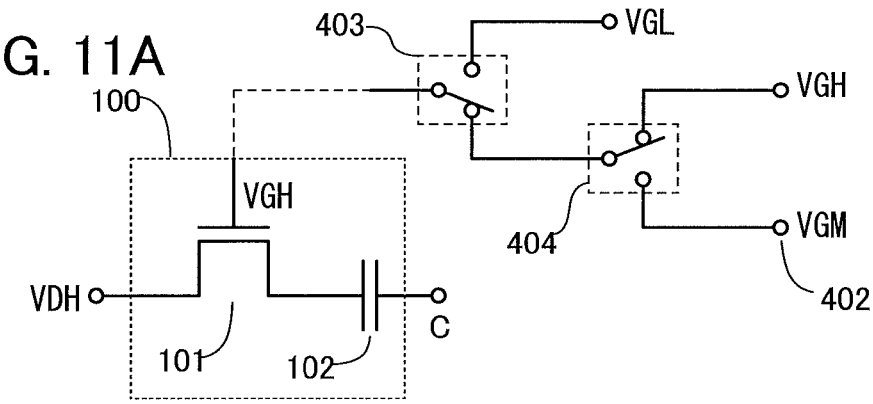
FIGS. 11A to 11D are diagrams illustrating an example of a method for inspecting a semiconductor memory device.

A procedure of the memory cell inspection using such a circuit is illustrated in FIGS. 11A to 11D. Note that as for numeral references or a detailed operation of the memory cell, FIGS. 3A to 3D may be referred to. First, as shown in FIG. 11A, the decoder 403 and the switch 404 are operated, the potential of the gate of the transistor 101 in the memory cell 100 is set to VGH, and data is written to the capacitor 102 (see FIG. 11A). This process corresponds to FIG. 3A.

Figure 11B:
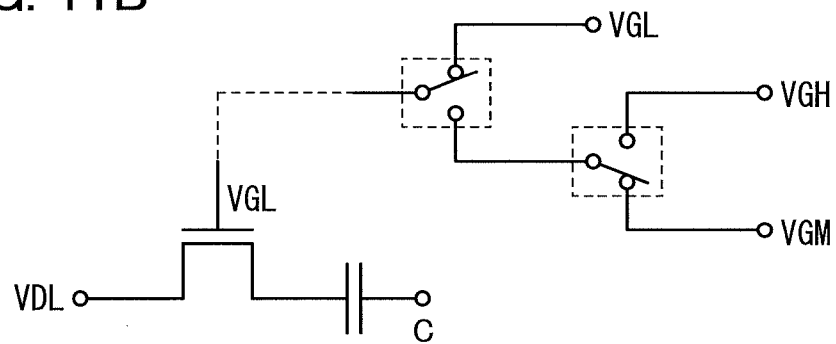
Figure 11C:
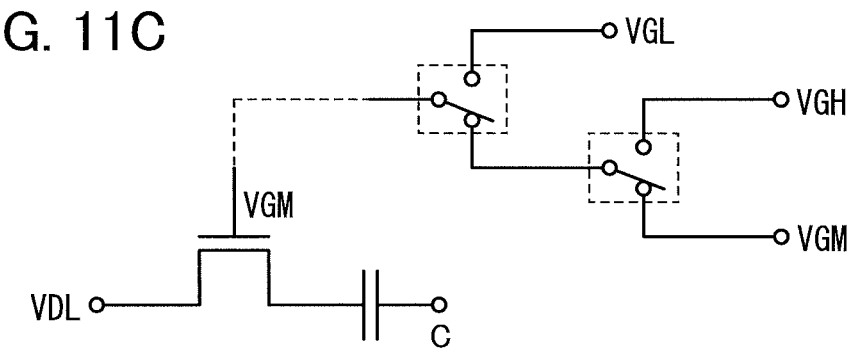

Then, the potential of the gate of the transistor 101 is set to VGL by operating the decoder 403. Further, the switch 404 selects the potential VGM (see FIG. 11B). This process corresponds to FIG. 3B. The operations shown in FIG. 11A and FIG. 11B are performed on the memory cells in all of the rows.

Then, the potential of the gate of the transistor 101 is set to VGM by operating the decoder 403. This state is held for a predetermined period (see FIG. 11C). This process corresponds to FIG. 3C. The potentials of the gates of the memory cells in the other rows memory cell are set to VGL during this period.

Figure 11D:
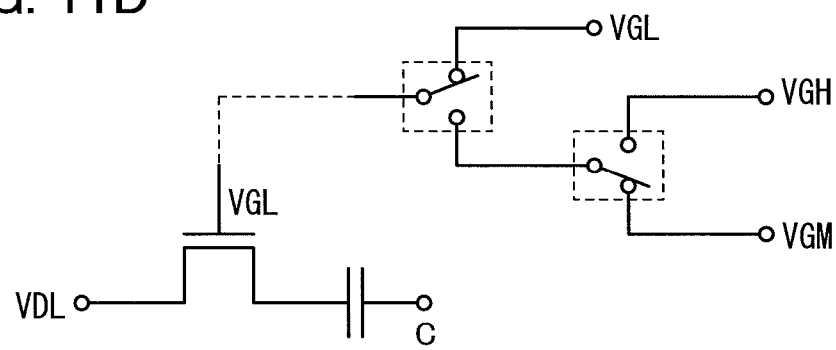

Then, the potential of the gate of the transistor 101 is set to VGL by operating the decoder 403 (see FIG. 11D). After that, the holding state of the data is inspected by reading operation of the memory cell 100. When the accuracy of the potential VGM is increased by using such a circuit, the data holding capability of the memory cell is judged more definitely.

In the above example, the potential VGH is supplied from the inside of the semiconductor memory device, but the potential VGH can be supplied from the outside of the semiconductor memory device like the potential VGM. In that case, another pad may be provided in addition to the pad 402, and the memory cell may be inspected by being in contact with one of the two probers for the potential VGH and the potential VGM and the pad 402. In the latter case, the switch 404 is not needed.

Embodiment 2

Figure 1B:
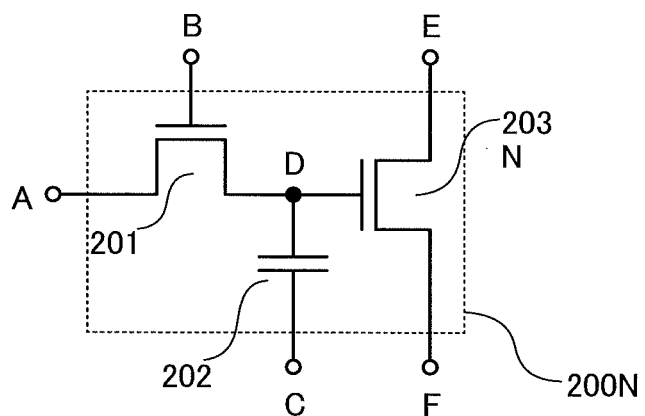
Figure 1C:
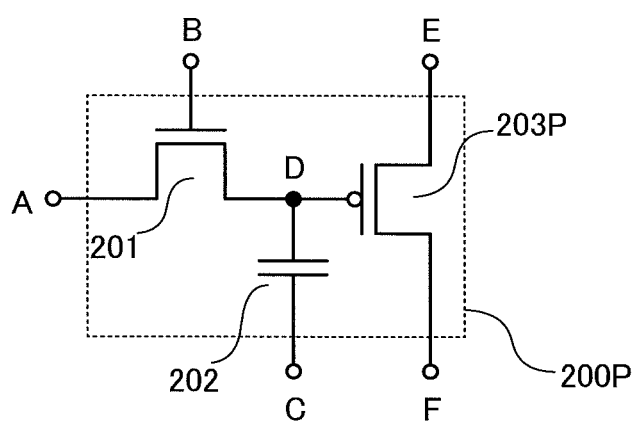

FIGS. 1B and 1C each show a circuit diagram of a memory cell in this embodiment. A memory cell 200N shown in FIG. 1B includes two transistors, a writing transistor 201 and an N-channel element transistor 203N, and a capacitor 202. The transistor 101 in Embodiment 1 can be referred to for the writing transistor 201.

Single crystal semiconductor with high mobility is preferably used for the element transistor 203N because reading speed is improved though a semiconductor with high mobility does not directly influence holding a charge. A gate insulating film preferably has a sufficient thickness in order to prevent a leakage current via a gate insulating film of the element transistor 203N. The on current is decreased when a gate insulating film is made thicker, whereby the high mobility semiconductor may also be used in order to prevent the decreasing.

Capacitance of the capacitor 202 is determined in consideration of resistance (or the drain current) of the writing transistor 201 when data is held. When the capacitance is increased, a period for holding data can be long. Note that unlike the memory cell 100 of Embodiment 1, a charge stored in the capacitor 202 is not diluted when data is read; thus the capacitance of the capacitor 202 can be $1 \times 10^{-16}$ F or lower, preferably $1 \times 10^{-17}$ F or lower. When the capacitance of the capacitor 202 is decreased as the above, a period for the writing operation can be extremely shorter.

As described below, unlike a DRAM, writing operation performed after reading data is not needed because data is not destroyed in reading data, that is an operation is simple, and power consumption can be reduced.

However, when the capacitance of the capacitor 202 is such a small value, a period for holding data becomes shorter. In order to prevent the period for holding data to shorten, the resistance between a source and a drain of a transistor when data is held is needed to be increased according to the short period for holding data. For example, in the case where the capacitance of the capacitor 202 is $1 \times 1 \times 10^{-17}$ F, data can be held for 10 years by setting the resistance between a source and a drain of the writing transistor 201 in holding data to be higher than or equal to $1 \times 10^{26}$ An operation of the memory cell 200N shown in FIG. 1B will be described with reference to FIG. 1B, FIG. 4A, and FIG. 4B. Data is held as a charge which is stored in the capacitor 202. At an initial stage, a potential of the terminal A and a potential of the terminal B are held at VDL and VGL respectively. At this time, a potential of a source D of the transistor 201 is VDL. Terminals C, E, and F are held at an appropriate potential. For the purpose of reducing power consumption, the terminal E and the terminal F are preferably at the same potential. For example, the terminals are all set at ground potential.

Figure 4A:
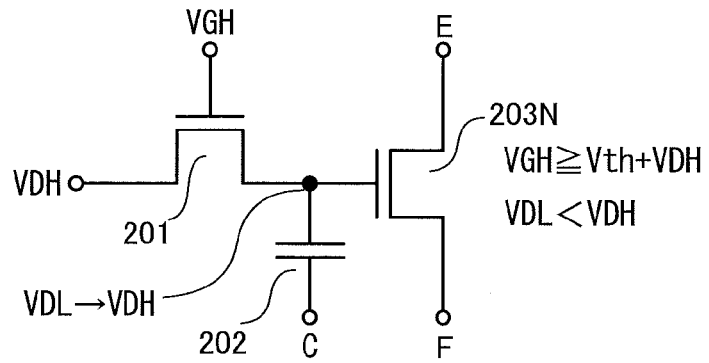
FIGS. 4A to 4D are diagrams illustrating an example of a method for inspecting a semiconductor memory device.

When data is written to the memory cell 200N, a potential according to data is applied to the terminal A Here, a potential VDH (>VDL) is applied to the terminal A Further, a potential which is higher than or equal to the threshold Vth of the writing transistor 201, for example a potential VGH which is higher than or equal to the sum of Vth and VDH is applied to the terminal B. Thus, a charge is stored in the capacitor 202, the potential of the source D of the writing transistor 201 is increased from VDL to VDH as shown in FIG. 4A.

Figure 4B:
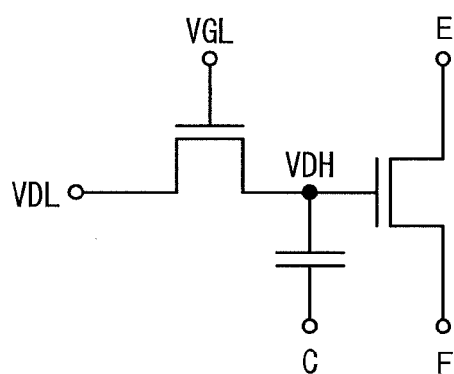

When data is held, a potential of the terminal A and a potential of the terminal B are held at VDL and VGL respectively similar to the initial stage (see FIG. 4B). Under the conditions, resistance between the source and the drain of the writing transistor 201 is extremely high. For example, when the capacitance of the capacitor 202 is $1\times10^{-17}$ F and the resistance between the source and the drain of the writing transistor 201 is $1\times10^{26}\Omega$, about 74% of the initial charge remains in the capacitor 202 even after 10 years pass.

Next, reading will be described. In the reading operation, a potential difference is generated between the terminal E and the terminal F, and an appropriate potential is applied to the terminal C. For example, the potential of the source D of the writing transistor 201 is at either of two potentials of H and L according to data. When the potential of the source D is H, a potential at which the element transistor 203N is turned on is applied to the terminal C, when the potential of the source D is L, a potential at which the element transistor 203N is turned off is applied to the terminal C.

When the threshold is +0.5V, VDL is 0V, and VDH is +2V in the element transistor 203N, the potential applied to the terminal C may be 0V. At this time, an amount of a charge stored in the capacitor 202 is decreased according to the holding period. For example, in the memory cell which can hold data for 10 years, the memory cell should be set so that a potential of the source D of the writing transistor 201 is higher than +0.5V after 10 years pass.

A determination as to whether the element transistor 203N is in an on or off state can be made according to a change in the current which flows between the terminal E and the terminal F or a change in the potential of the terminal E or the terminal F. Therefore, the potential of the source D of the writing transistor 201, i.e., data written, can be known by finding out the state of the element transistor 203N. In order to find out the state of the element transistor 203N, the terminal E (or the terminal F) is generally connected to a reading circuit.

Note that in the case of reading data of another memory cell, the potential of the terminal C is set to a potential at which the element transistor 203N is turned on or off, regardless of the potential of the source D of the writing transistor 201. When the threshold is +0.5V, VDL is 0V, and VDH is +2V in the element transistor 203N, regardless of the potential of the source D of the writing transistor 201, the element transistor 203N is turned on by applying a potential higher than +0.5V to the terminal C, the element transistor 203N is turned off by applying a potential lower than −1.5V to the terminal C.

In order to reduce power consumption, in the case of a NOR memory device, the element transistor 203N is preferably in an off state except when the memory cell is read. On the other hand, in the case of a NAND memory device, it is required that all memory cells other than the memory cell within a NAND circuit are in an on state.

Note that in the memory cell 200N shown in FIG. 1B, the charge stored in the capacitor 202 does not leak at the time of reading. Therefore, a writing operation after a reading operation in the memory cell 200N is not needed, which is different from the memory cell shown in Embodiment 1.

That is an example in which one memory cell stores one of two kinds (two levels) of data; one memory cell can also store any of three or more kinds (multiple levels) of data by using three or more levels of voltages for the terminal A in the writing operation. The capability of one memory cell to store multiple levels of data provides substantially the same effect as increasing the degree of integration.

FIG. 1C shows a circuit diagram of another memory cell. In a memory cell 200P illustrated in FIG. 1C, the writing transistor 201 and the capacitor 202 are the same as those in FIG. 1A, but an element transistor is a P-channel transistor (an element transistor 203P). The number of terminals may be reduced by improving the circuit illustrated in FIG. 1B or FIG. 1C.

Figure 6A:
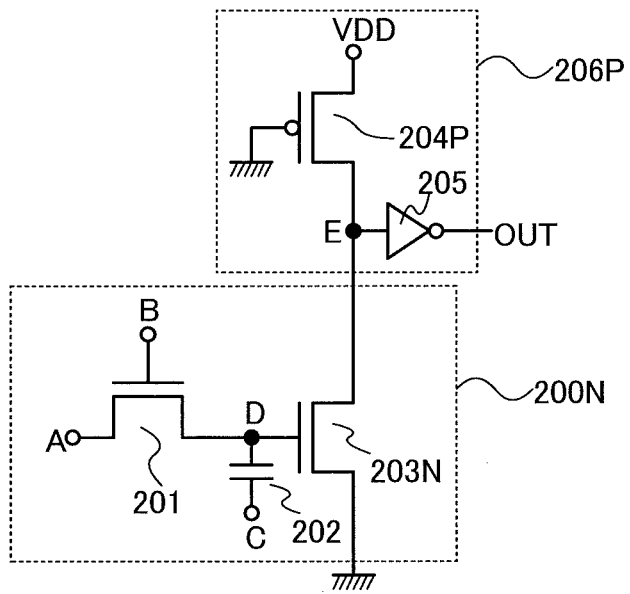
FIGS. 6A and 6B are diagrams each illustrating an example of a semiconductor memory device.

As described above, the terminal E (or the terminal F) in the memory cell 200N shown in FIG. 1B is connected to a reading circuit. FIG. 6A illustrates a semiconductor memory device in which a reading circuit 206P is added to the memory cell 200N illustrated in FIG. 1B. The reading circuit 206P includes a P-channel reading transistor 204P and an inverter 205. A reading data is output from the inverter 205. As illustrated in FIG. 6A, a source of the N-channel element transistor 203N of the memory cell 200N is grounded, and a drain thereof is connected to a drain of the reading transistor 204P.

A source of the reading transistor 204P is connected to a power supply potential VDD, and a gate thereof is grounded. The drain of the element transistor 203N and the drain of the reading transistor 204P are connected to an input terminal of the inverter 205. An intersection thereof is hereinafter referred to as a node E. Note that the reading transistor 204P is preferably designed such that the on-state current of the reading transistor 204P is lower than the on-state current of the element transistor 203N under the same conditions (such as a gate potential or a drain potential) in consideration of polarity.

A reading operation using the reading circuit 206P will be briefly described. When a potential for reading is applied to the terminal C, the element transistor 203N is in some state depending on the potential of the source D of the writing transistor 201 in the memory cell 200N. According to this state, the potential of the node E of the reading circuit 206P varies. When this potential is higher than an intermediate value between (an average value of) the power supply potential VDD and the ground potential, an output of the inverter 205 is the ground potential, and when lower than the intermediate value, the output of the inverter 205 is the power supply potential VDD. By this output, the data held in the memory cell 200N can be determined.

In a normal reading operation, because the element transistor is an N-channel transistor, the potential of the node E is the ground potential when data H is written; thus, an output of the inverter 205 is the power supply potential VDD. When data L is written, the potential of the node E is the power supply potential VDD; thus, the output of the inverter 205 is the ground potential.

Figure 6B:
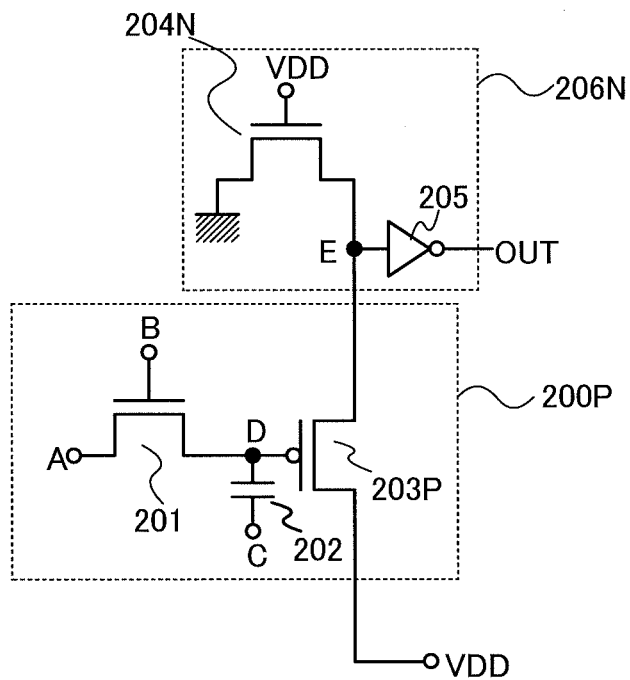

FIG. 6B illustrates a semiconductor memory device in which a reading circuit 206N is added to the memory cell 200P illustrated in FIG. 1C. A different from FIG. 6A is that the polarities of both the element transistor and the reading transistor are opposite. Note that the reading transistor 204N is preferably designed such that the on-state current of the reading transistor 204N is lower than the on-state current of the element transistor 203P under the same conditions (such as a gate potential or a drain potential) in consideration of polarity.

Note that in a normal reading operation, an output of the inverter 205 is the power supply potential VDD when data H is written in the memory cell. When data L is written, the output is the ground potential.

In such a memory cell, a method for detecting a memory cell which has difficulty in holding data will be described with reference to FIG. 4A, FIG. 4C and FIG. 4D. First, a charge is stored in the capacitor 202 as shown in FIG. 4A.

Then a charge is held. At that time, the potential of the terminal B is set to the predetermined potential VGM between a potential VGL which is used in holding a charge normally and threshold Vth. An optimal value of the potential VGM varies depending on the capacitance of the capacitor 202, a period of holding data in normal use, a characteristic of the writing transistor 201 (in particular, S value), and a period of holding data for the inspection.

For example, when the capacitance of the capacitor 202 is $1 \times 10^{-17}$ F and it ensures that data can be held for 10 years in normal use, resistance between a source and a drain of the transistor is preferably higher than or equal to $1 \times 10^{26} \Omega$ at a potential VGL used in data holding. Moreover, when the S value of the writing transistor 201 is 60 mV/decade and a holding time for the inspection of data holding capability of the memory cell is 0.3 seconds, the potential VGM may be (VGL+0.54) [V].

Figure 4C:
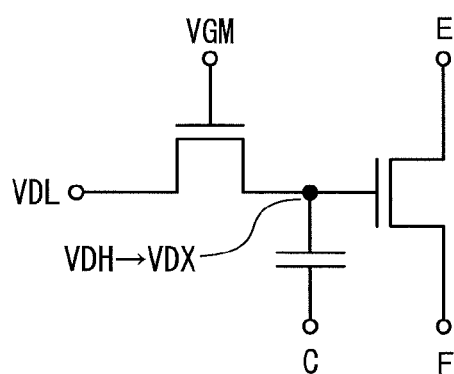

In the holding period, the potential of the source of the writing transistor 201 is decreased from the initial VDH to VDX (VDL<VDX<VDH) (see FIG. 4C). This is in the same state in which 10 years have passed in the normal data holding (the state in which the potential of the terminal B is held at VGL).

Figure 4D:
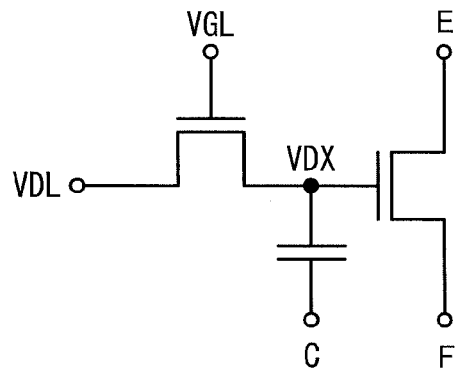

After the holding period, the potential of the terminal B is set to be VGL (see FIG. 4D). Further, by applying a potential for reading (e.g., 0V) to the terminal C, the element transistor 203N is turned on or off depending on data, and then data is read. It can be judged that the data holding capability of the memory cell which cannot output the data same as that in writing is low.

For example, a memory cell which can hold data for 10 years or more in normal use can output same data as writing data, because the potential VDX of the source D of the writing transistor 201 is higher than the threshold of the element transistor 203N.

On the other hand, in a memory cell which can hold data for only about one year in normal use, the potential VDX of the source of the writing transistor 201 is decreased considerably, and the potential VDX of the source of the writing transistor 201 is lower than the threshold of the element transistor 203N. As a result, data which is different from writing data is read. Therefore, this inspection can judge whether the holding capability of data is enough or not.

Meanwhile, VGM may be higher than or equal to (VGL+0.48) [V] or, lower than or equal to (VGL+0.54) [V] in some cases, because the potential VGM used in the above inspection cannot be controlled with sufficient accuracy. In such a case, the measurement is performed plural times by using the potential. For example, three holding times, e.g., 0.3 seconds, 1 second, and 3 seconds, are provided; the inspection may be operated at least three times. In order to enhance the accuracy, the inspection may be performed plural times in the same holding time. By comprehensively judging such inspection results, a memory cell whose data holding capability does not satisfy standard can be found.

Note that the reading circuit 206P or 206N shown in FIG. 6A or FIG. 6B includes the inverter 205, but a sense amplifier circuit may be used instead of the inverter. For the detailed description of a sense amplifier, Embodiment 1 can be referred to. In this embodiment, the output of the sense amplifier changes depending on the magnitude relation between the potentials of the node E and a reference potential VREF, which makes it possible to find out the data stored in the memory cell.

Embodiment 3

Figure 7:
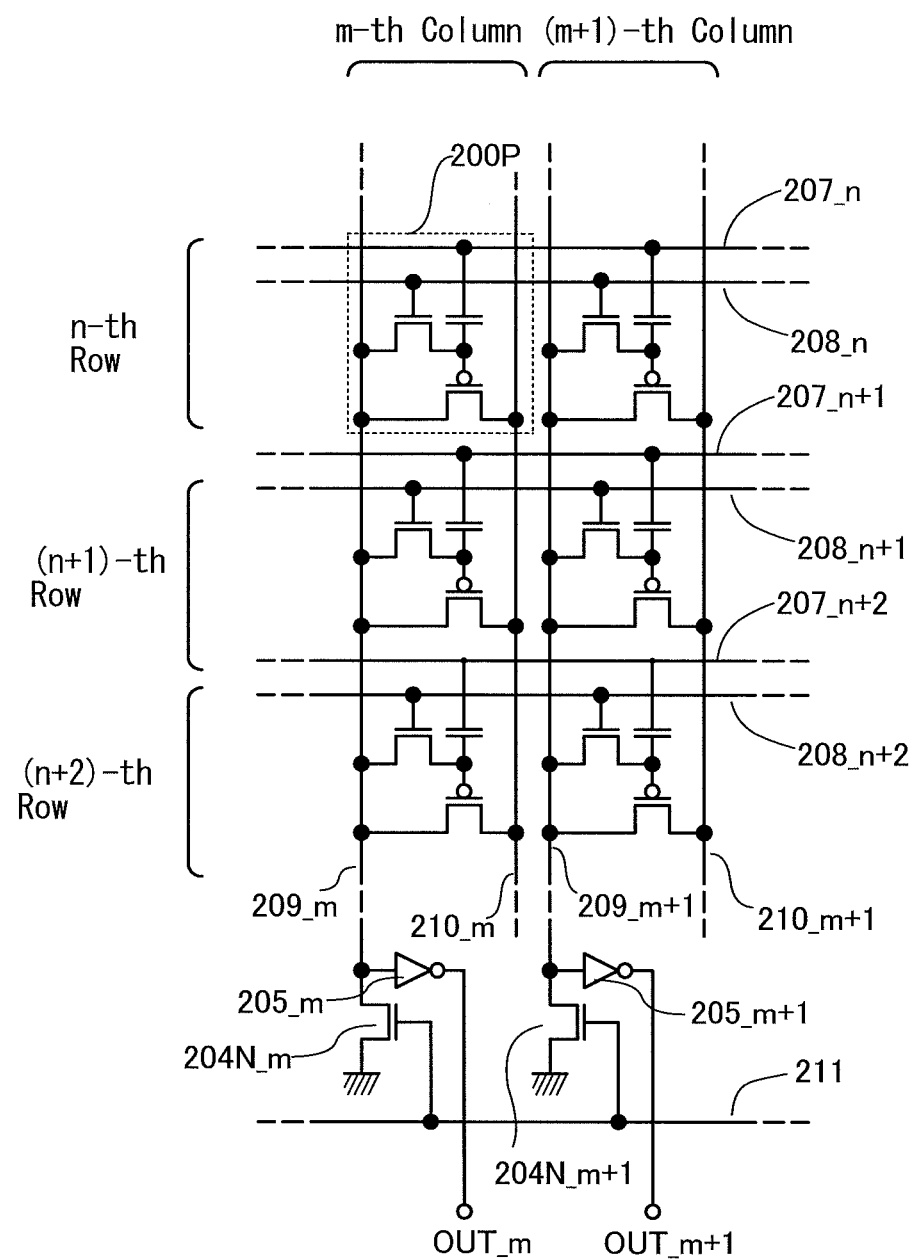
FIG. 7 is a diagram illustrating an example of a semiconductor memory device.

An example of driving the memory cells described in Embodiment 2, which are arranged in matrix, will be described with reference to FIG. 7. FIG. 7 illustrates part of a semiconductor memory device, which includes six memory cells provided in a n-th row and m-th column to a (n+2)-th row and (m+1)-th column (n and m are natural numbers). Each memory cell is same as that in FIG. 1C. For details, FIG. 1C may be referred to.

An example of writing will be described below. First, potentials of all read word lines including a read word line 207_n, a read word line 207_n+1, and a read word line 207_n+2 and potentials of all source lines including a source line 210_m and a source line 210_m+1 are set to a ground potential.

A read line 211 to which gates of read transistors (including a read transistor 204N_m and a read transistor 204N_m+1) are connected is set at the ground potential, so that all the read transistors are off.

In such a state, a potential of a write word line 208_n is set to VGH, and potentials of write word lines in the other rows, including a write word line 208_n+1 and a write word line 208_n+2 are set to VGL. Further, all bit lines including a bit line 209_m and a bit line 209_m+1 is each supplied with a signal according to data to be written to the memory cells in the n-th row. The signal may be a two-level signal or a multilevel signal. By this operation, only the writing transistors in the n-th row are turned on, and data is written to the memory cells in the n-th row.

Next, all the write word lines other than the write word line 208_n+1 are supplied with the potential VGL, and only the write word line 208_n+1 is supplied with the potential VGH. Furthermore, all the bit lines including the bit line 209_m and the bit line 209_m+1 are each supplied with a signal according to data to be written to the memory cells in the (n+1)-th row. By this operation, data is written to the memory cells in the (n+1)-th row.

Furthermore, all the write word lines other than the write word line 208_n+2 are supplied with the potential VGL, and only the write word line 208_n+2 is supplied with the potential VGH. Furthermore, all the bit lines including the bit line 209_m and the bit line 209_m+1 are each supplied with a signal according to data to be written to the memory cells in the (n+2)-th row. By this operation, data is written to the memory cells in the (n+2)-th row.

By performing such an operation as described above, data can be written to all the memory cells. In the above example, data are written to the memory cells in all of the rows, whereas an operation of writing data only to a specific row or an operation of not writing data to a specific row may be performed.

While data is held, potentials of all the write word lines 208 are VGL, and potentials of the bit lines 209 are VDL.

In the case of reading, a potential of the read line 211 is set to an appropriate positive potential (e.g., a power supply potential). Further, potentials of all the write word lines are set to VGL. Then, for example, in the case where data of the memory cells in the n-th row is read, potentials of the read word lines in the rows other than the n-th row are set to potentials at which the element transistors are turned off, regardless of written data. On the other hand, a potential of the read word line 207_n is set to an appropriate potential for reading.

As a result, the element transistors 203P are turned on or off in accordance with the written data. The potentials of the bit lines 209 change in accordance with on/off of the element transistors, whereby data can be determined from outputs of the inverters 205.

In order to inspect the data holding capability of the memory cell, like Embodiment 2, a potential VGM (VGL<VGM<Vth) is supplied to the write word lines and held for a predetermined period, and then data is read out. Thus, data holding capability of each memory cell is inspected. A plurality of holding periods may be provided, and by examination conducted plural times, a memory cell whose data holding capability is assumed to be low may be detected. Further, the memory cell which is judged to have low data holding capability may be replaced with a spare memory cell.

Embodiment 4

Figure 8:
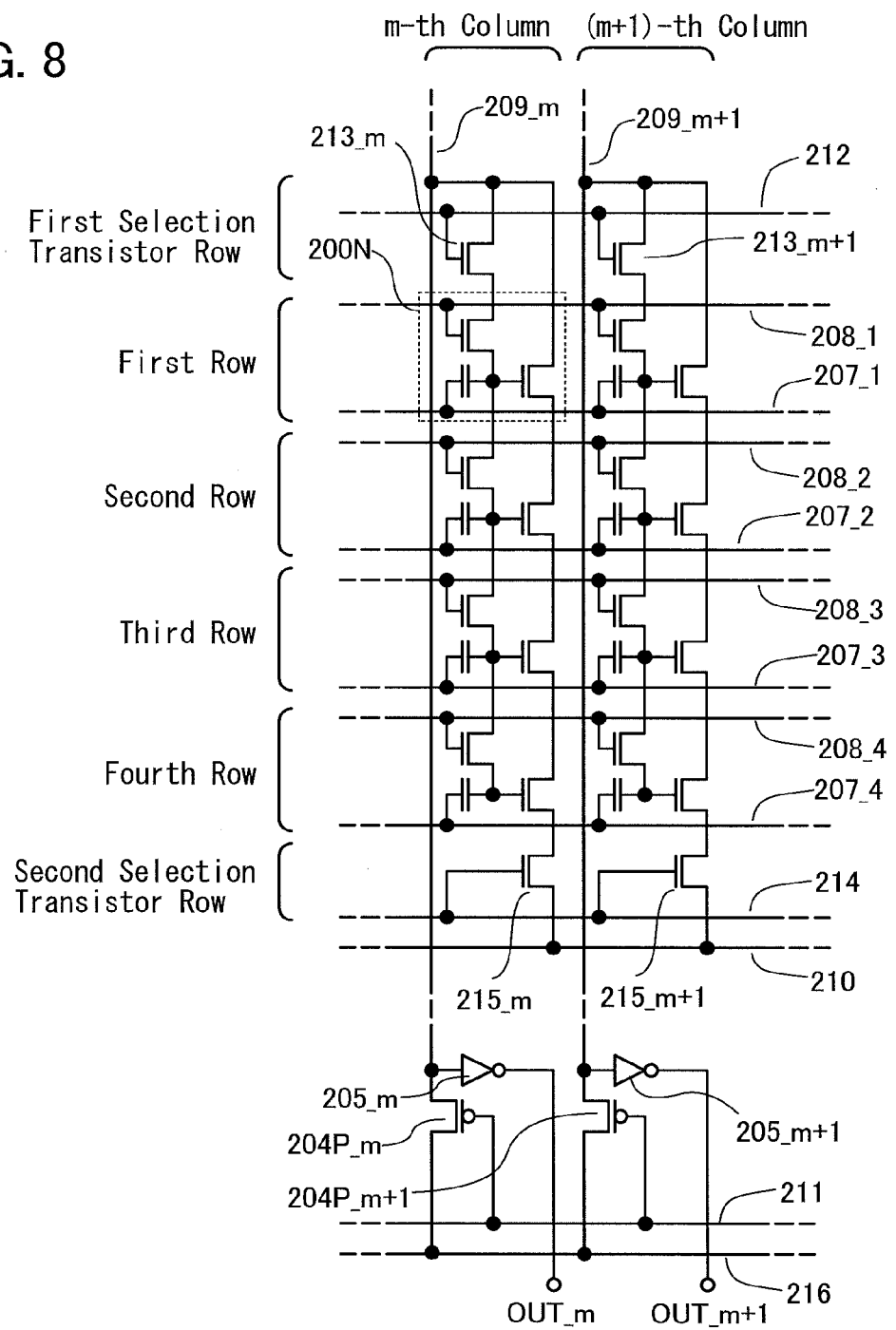
FIG. 8 is a diagram illustrating an example of a semiconductor memory device.

An example of driving a NAND semiconductor memory device will be described with reference to FIG. 8. FIG. 8 illustrates part of a NAND semiconductor memory device, which includes eight memory cells in a first row and m-th column to a fourth row and (m+1)-th column (m is a natural number). The memory cell used in this NAND semiconductor memory is same as that illustrated in FIG. 1B. Each memory cell includes an N-channel element transistor, a writing transistor, and a capacitor, and for details, FIG. 1B may be referred to.

The semiconductor memory device of this embodiment is a NAND type and thus has a circuit configuration different from that of the semiconductor memory device illustrated in FIG. 7. In the same column, writing transistors in the first to fourth rows are connected in series, and element transistors in the first to fourth rows are connected in series.

Furthermore, first selection transistors 213_m and 213_m+1 are provided between the writing transistors in the first row and bit lines 209_m and 209_m+1 so as to be connected in series, and second selection transistors 215_m and 215_m+1 are provided between the element transistors in the fourth row and a source line 210 so as to be connected in series.

Gates of the first selection transistors 213_m and 213_m+1 are connected to a first selection line 212, and gates of the second selection transistors 215_m and 215_m+1 are connected to a second selection line 214. Further, gates of the writing transistors in the memory cells are connected to respective write word lines 208 (write word lines 208_1, 208_2, 208_3, and 208_4).

Note that it is effective in improving the degree of integration to provide the source line 210 in parallel with the write word lines as illustrated in FIG. 8, whereas the source line 210 may be provided in parallel with the bit lines. The source line 210 may be constantly set at a ground potential. In the following description, the source line 210 is constantly set at the ground potential. Further, a potential of a wiring 216 to which sources of read transistors 204P_m and 204P_m+1 are connected is constantly set at an appropriate positive potential (e.g., a power supply potential). Note that a reading circuit in this embodiment is same as that illustrated in FIG. 6A.

An example of writing will be described below. First, potentials of read word lines 207_1, 207_2, 207_3, and 207_4 are set at a ground potential. Potentials of the write word lines 208_1, 208_2, 208_3, and 208_4 are set to the potential VGH. As a result, the writing transistors in the memory cells illustrated in FIG. 8 are turned on.

Further, the second selection line 214 and a read line 211 are set at the ground potential and an appropriate positive potential, respectively, so that the second selection transistors 215_m and 215_m+1 and the read transistors 204P_m and 204P_m+1 are turned off. Furthermore, the first selection line 212 is supplied with an appropriate positive potential, so that the first selection transistors 213_m and 213_m+1 are turned on.

In that state, the bit lines 209_m and 209_m+1 are each supplied with a signal according to data to be written to the memory cells in the fourth row. The signal may be a two-level signal or a multilevel signal. By this operation, data is written to the memory cells in the first to fourth rows. Then, the write word line 208_4 in the fourth row is supplied with the potential VGL so that the writing transistors in the fourth row are turned off. As a result, data is held in the memory cells in the fourth row.

Furthermore, the bit lines 209_m and 209_m+1 are each supplied with a signal according to data to be written to the memory cells in the third row. By this operation, data is written to the memory cells in the first to third rows. Then, the write word line 2083 in the third row is supplied with the potential VGL so that the writing transistors in the third row are turned off. As a result, data is held in the memory cells in the third row.

In a similar manner, the following operation is repeated: each of the bit lines 209_m and 209_m+1 is supplied with a signal according to data to be sequentially written to the memory cells in the second row and the first row and then the potential VGL is applied to the write word line in the corresponding row so that the writing transistors in the corresponding row are turned off. Thus, data is held in the memory cells in the first to fourth rows. After that, the first selection line 212 is set at the ground potential so that the first selection transistors 213_m and 213_m+1 are turned off.

While data is held, potentials of all the write word lines 208 are set to VGL, and potentials of the bit lines 209 are set to VDL.

Reading is performed as follows. For example, the case where data of the memory cells in the third row is read out is considered. In that case, a potential of the read word line 207_3 is set to a potential for reading. On the other hand, potentials of the read word lines in the other rows are set to a potential at which the element transistors 203N are turned on, regardless of written data. In addition, a potential of the second selection line 214 is set to an appropriate positive potential, so that the second selection transistors 215_m and 215_m+1 are turned on. Furthermore, in order to drive a reading circuit, a potential of the read line 211 is set at a ground potential.

As a result, potentials of the bit lines 209 change in accordance with on/off of the element transistors 203N in the third columns, so that data can be determined from outputs of the inverters 205.

Inspection of data holding capability of the memory cell is described below. For example, the case where data holding capability of the memory cells in the third row is described. In that case, a potential of the write word line 208_4 is set to VGL, and potentials of the write word lines 208_1 and 208_2 are set to VGH.

Further, like Embodiment 2, a potential VGM (VGL<VGM<Vth) is supplied to the write word line 2083 and held for a predetermined period, and then data is read out. In such a manner, data holding capability of the memory cells in the third row is inspected. A plurality of holding periods may be provided, and by examination conducted plural times, a memory cell whose data holding capability is assumed to be low may be detected. Further, the memory cell which is judged to have low data holding capability may be replaced with a spare memory cell.

Embodiment 5

In this embodiment, the case where the semiconductor device described in any of the above embodiments is applied to an electronic device will be described with reference to FIGS. 9A to 9D. In this embodiment, the cases where any of the above-described semiconductor devices is applied to electronic devices such as a computer, electronic paper, a television device (also referred to as a TV or a television receiver), and a memory card will be described.

Figure 9A:
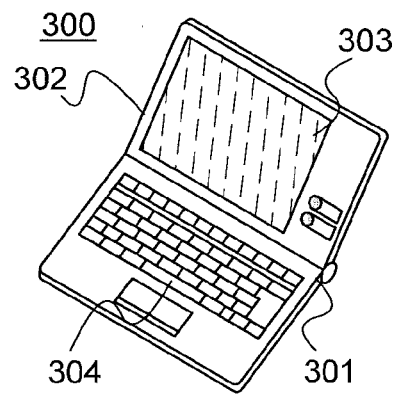
FIGS. 9A to 9D are diagrams each illustrating an example of an electronic device using a semiconductor memory device.

FIG. 9A illustrates a notebook personal computer 300, which includes a housing 301, a housing 302, a display portion 303, a keyboard 304, and the like. At least one of the housings 301 and 302 may be provided with the semiconductor device described in any of the above embodiments. Thus, a notebook personal computer with sufficiently low power consumption, in which data can be held for a long time, can be realized.

Figure 9B:
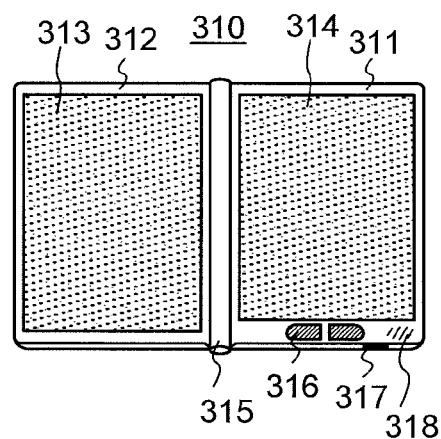

FIG. 9B illustrates an electronic book 310 incorporating electronic paper, which includes two housings, a housing 311 and a housing 312. The housing 311 and the housing 312 include a display portion 314 and a display portion 313, respectively. The housing 311 is connected to the housing 312 by a hinge 315, so that the electronic book can be opened and closed using the hinge 315 as an axis. The housing 311 is provided with operation keys 316, a power button 317, a speaker 318, and the like. At least one of the housings 311 and 312 may be provided with the semiconductor device described in any of the above embodiments. Thus, an electronic book with sufficiently low power consumption, in which data can be held for a long time, can be realized.

Figure 9C:
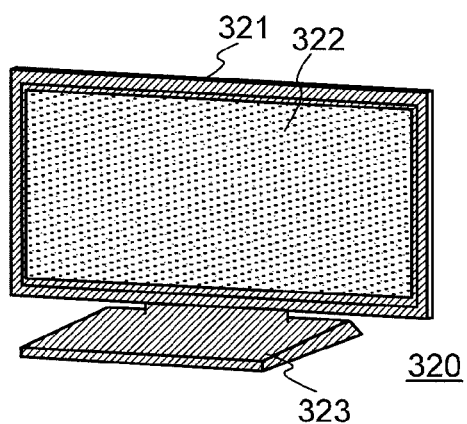

FIG. 9C illustrates a television device 320 which includes a housing 321, a display portion 322, a stand 323, and the like. The housing 321 can be provided with the semiconductor device described in any of the above embodiments for recording of videos and sounds. Thus, a television device with sufficiently low power consumption, in which data can be held for a long time, can be realized.

Figure 9D:
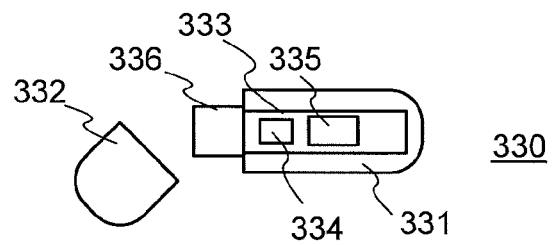

FIG. 9D illustrates a memory card 330 including a USB connector (commonly called a USB memory, a USB stick, a pen drive, or the like). The memory card 330 includes a main housing 331 and a cap 332. The housing 331 is provided with a substrate 333 and a USB connector 336. The substrate 333 is provided with a semiconductor memory device 335 which is the semiconductor memory device described in any of embodiments and a control circuit 334. The control circuit 334 is used for exchanging data between the memory card 330 and an electronic device in a state where the memory card 330 is inserted into the electronic device.

As described above, the electronic devices described in this embodiment each include the semiconductor device according to any of the above embodiments. Therefore, electronic devices with low power consumption, in which data can be held for a long time, can be realized. It is needless to say that a similar effect can be obtained when an electronic device other than those illustrated in FIGS. 9A to 9D incorporates the semiconductor device according to any of the above embodiments.

This application is based on Japanese Patent Application serial no. 2010-202836 filed with Japan Patent Office on Sep. 10, 2010, the entire contents of which are hereby incorporated by reference.

What is claimed is:

1. A method for inspecting a semiconductor memory device, the semiconductor memory device comprising:
a memory cell comprising:
a capacitor; and
a transistor, wherein one of a source and a drain of the transistor is connected to the capacitor,
the method for inspecting a semiconductor memory device comprising the steps of:
a first step of storing a charge in the capacitor;
a second step of holding a potential of a gate of the transistor at a predetermined potential between a holding potential and a threshold of the transistor for a predetermined period after the first step; and
a third step of measuring an amount of a charge stored in the capacitor after the second step.

2. The method for inspecting the semiconductor memory device according to claim 1, wherein the transistor is an N-channel transistor.

3. The method for inspecting the semiconductor memory device according to claim 1, wherein the transistor includes an oxide semiconductor.

4. The method for inspecting the semiconductor memory device according to claim 1, wherein a memory cell whose amount of the charge is not judged to satisfy the standard by the third step is replaced with a spare memory cell.

5. The method for inspecting the semiconductor memory device according to claim 1, wherein the semiconductor memory device is a NAND type.

6. A method for inspecting a semiconductor memory device, the semiconductor memory device comprising:
a memory cell comprising:
a capacitor;
a first transistor, wherein one of a source and a drain of the first transistor is connected to the capacitor; and
a second transistor, wherein the one of the source and the drain of the first transistor is connected to a gate of the second transistor,
the method for inspecting a semiconductor memory device comprising the steps of:
a first step of storing a charge in the capacitor;
a second step of holding a potential of a gate of the first transistor at a predetermined potential between a holding potential and a threshold of the first transistor for a predetermined period after the first step; and
a third step of measuring an amount of a charge stored in the capacitor after the second step.

7. The method for inspecting the semiconductor memory device according to claim 6, wherein the first transistor is an N-channel transistor.

8. The method for inspecting the semiconductor memory device according to claim 6, wherein the first transistor includes an oxide semiconductor.

9. The method for inspecting the semiconductor memory device according to claim 6, wherein a memory cell whose amount of the charge is not judged to satisfy the standard by the third step is replaced with a spare memory cell.

10. The method for inspecting the semiconductor memory device according to claim 6, wherein the semiconductor memory device is a NAND type.

* * * * *